United States Patent
Hannan et al.

(10) Patent No.: US 6,590,435 B1
(45) Date of Patent: Jul. 8, 2003

(54) OUTPUT DIFFERENTIAL VOLTAGE (VOD) RESTRICTION CIRCUIT FOR USE WITH LVDS INPUT BUFFERS

(75) Inventors: Douglas M. Hannan, Gray, ME (US); David J. Haas, Old Orchard Beach, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/931,789

(22) Filed: Aug. 16, 2001

(51) Int. Cl.[7] .............................. H03K 5/08; H03L 5/00
(52) U.S. Cl. ........................................ 327/321; 327/320
(58) Field of Search ................................ 327/318, 309, 327/321, 563, 320

(56) References Cited

U.S. PATENT DOCUMENTS 5,206,550 A * 4/1993 Mehta ........................ 327/309
5,392,045 A * 2/1995 Yee ............................. 320/104
5,920,206 A * 7/1999 Matsumoto .................. 326/126

* cited by examiner

Primary Examiner—Timothy P. Callahan
Assistant Examiner—Cassandra Cox
(74) Attorney, Agent, or Firm—Merchant & Gould P.C.; Timothy P. Sullivan

(57) ABSTRACT

A method and apparatus that restrict the differential output voltage (VOD) for an LVDS input buffer is provided. Specifically, VOD is prevented from exceeding a predetermined threshold. The input and output common-mode voltage, as well as the input and output differential voltage swing, are maintained during the VOD restriction. The VOD restriction reduces output jitter of the LVDS input buffer and provides a more robust LVDS system as compared to an LVDS system not using a VOD restriction circuit. Clamping circuits are used to restrict the VOD. Each half of the differential output voltage may be clamped to restrict the differential output voltage. The clamping circuits are activated in response to the VOD reaching the predetermined threshold. When a clamping circuit is active, an alternate current path is provided maintaining the level of the signal before clamping.

20 Claims, 3 Drawing Sheets

OUTPUT DIFFERENTIAL VOLTAGE (VOD) RESTRICTION CIRCUIT FOR USE WITH LVDS INPUT BUFFERS

FIELD OF THE INVENTION

The present invention is related to electronic circuits, and more specifically to voltage restriction circuits for use with LVDS input buffers.

BACKGROUND OF THE INVENTION

Differential signaling has been in existence for many years. For example, teletypes were some of the first equipment to use differential signaling to communicate. Electronic devices (i.e. computers) often communicate between ports by means of Low Voltage Differential Signaling (LVDS) driver and receiver pairs.

LVDS is a differential signaling technique commonly used in data transmission systems. A low voltage differential signal produced by a line driver typically has peak-to-peak amplitudes in the range from 250 mV to 450 mV. The low voltage swing minimizes power dissipation, while maintaining high transmission speeds. Typical transmission speeds are over 100 Mbps (Mega-bits per second).

LVDS input buffers are designed to receive a wide variety of input signals while producing a fairly constant output signal. The input signals received by the LVDS input buffers may vary in frequency, peak-to-peak voltage, as well as common-mode voltage. Some LVDS input buffers, however, generate jitter that may cause problems within the LVDS system.

SUMMARY OF THE INVENTION

The present invention is directed at restricting the differential output voltage (VOD) for LVDS input buffers. Specifically, VOD is prevented from exceeding a predetermined threshold. The input and output common-mode voltage, as well as the input and output differential voltage swing, are maintained during the VOD restriction. The VOD restriction reduces output jitter of the LVDS input buffer and provides a more robust LVDS system as compared to an LVDS system not using a VOD restriction circuit.

According to one aspect of the invention, the VOD of the LVDS input buffer is restricted when a predetermined threshold has been reached. According to one embodiment of the invention, the predetermined threshold is about 650 mV.

According to another aspect of the invention, clamping circuits are used to restrict the VOD. Each half of the differential output voltage may be clamped to restrict the differential output voltage to be below or at the predetermined threshold. The clamping circuits are activated in response to the VOD reaching the predetermined threshold.

According to yet another aspect of the invention, an alternate signal path is created when a clamping circuit is activated. The alternate current path helps to ensure that the output signals from the VOD restriction circuit are maintained at the previous levels before the clamping circuits activate.

According to another aspect of the invention, an apparatus for restricting a differential output voltage of an input buffer is provided. The apparatus includes a first and second current-limiting device for producing the differential output voltage. The apparatus also includes a first and second clamping circuit that restricts the VOD based upon a predetermined threshold.

According to a further aspect of the invention, a method for restricting a differential output voltage of an LVDS input buffer is provided. The differential output voltage is restricted to help ensure that the VOD does not exceed a predetermined threshold. The VOD is monitored to determine when the VOD reaches the predetermined threshold. Clamping is activated when the predetermined threshold is reached thereby restricting VOD. An alternate current path is also provided allowing the output signal to be maintained during the clamping. The clamping is deactivated when the measured VOD is less than the predetermined threshold.

DETAILED DESCRIPTION OF THE PREFERRED EMBODIMENT

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal.

Briefly described, the present invention is directed at providing a method and apparatus for restricting the differential output voltage (VOD) of an LVDS input buffer. Clamp circuits are activated to restrict VOD within a predetermined range. The clamp circuits provide an alternate signal path while VOD is clamped, thereby maintaining the signal level.

Figure 1:
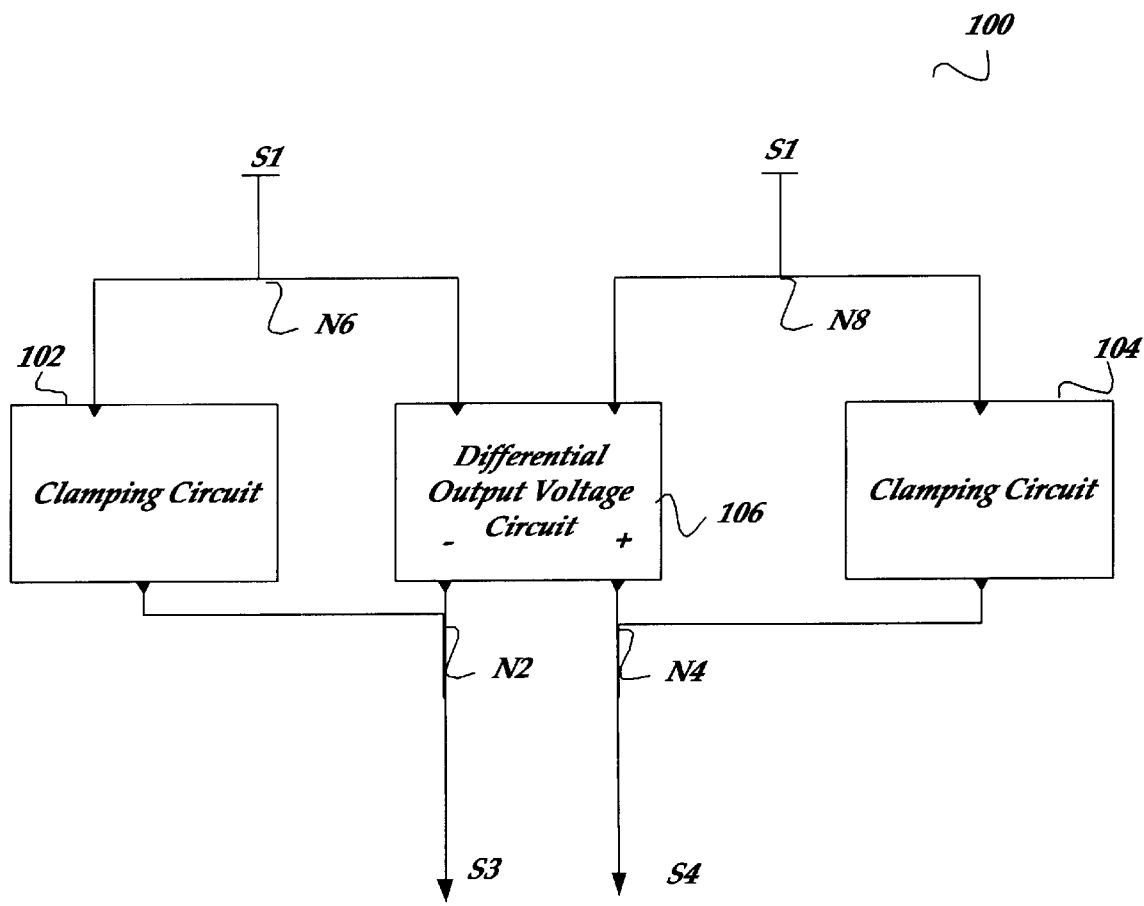
FIG. 1 illustrates a schematic block diagram of an output differential voltage restriction (VOD) restriction circuit for use with LVDS input buffers.

FIG. 1 is a schematic block diagram of an output differential voltage (VOD) restriction circuit for use with LVDS input buffers, in accordance with aspects of the invention. As shown in the figure, VOD restriction circuit 100 includes clamping circuit 102, clamping circuit 104, and differential output voltage circuit 106.

Clamping circuit 102 has an input coupled to node N6 and an output coupled to node N2. Clamping circuit 104 has an input coupled to node N8 and an output coupled to node N4. Differential output voltage circuit 106 has an input coupled to node N6, an input coupled to node N8, an output coupled to node N2, and an output coupled to node N4. Node N6 and node N8 are coupled to signal S1.

VOD restriction circuit 100 is directed at preventing the differential output voltage produced by differential output voltage circuit 106 from exceeding a predetermined threshold. According to one embodiment of the invention, the predetermined threshold is 650 mV.

Differential output voltage circuit 106 produces signals S3 and S4 in response to signal S1. Clamping circuit 102 and clamping circuit 104 restrict VOD from exceeding a predetermined threshold. Clamping circuit 102 and clamping circuit 104 are both inactive ("off") when the differential output voltage produced by differential output voltage circuit 106 is less than the predetermined threshold. Signal S1 does not pass through clamping circuit 102 and clamping circuit 104 during the periods clamping circuit 102 and clamping circuit are 104 are off. While the clamping circuits are off, signal S1 is routed to differential output voltage circuit 106.

Clamping circuit 102 activates (turns "on") when the negative half of the differential output voltage becomes lower than the positive half of the differential output voltage by the predetermined threshold. Upon activation of clamping circuit 102, an alternate signal path is created. While clamping circuit 102 is on, signal S1 is received by clamping circuit 102 creating an alternate path to node N2. Signal S3, therefore, remains constant.

Clamping circuit 104 activates when the positive half of the differential output voltage becomes lower then the negative half of the differential output voltage by the predetermined threshold. Upon activation of clamping circuit 104, an alternate signal path is created. While clamping circuit 104 is on, signal S1 is received by clamping circuit 104 creating an alternate path to node N4. Signal S4, therefore, remains constant.

An alternate current path is provided when either clamping circuit 102 or 104 is active. When clamping circuit 102 is active or when clamping circuit 104 is active, the differential output voltage is restricted. The differential output voltage is thereby prevented from exceeding the predetermined threshold by activation of clamping circuit 102 or clamping circuit 104.

Figure 2:
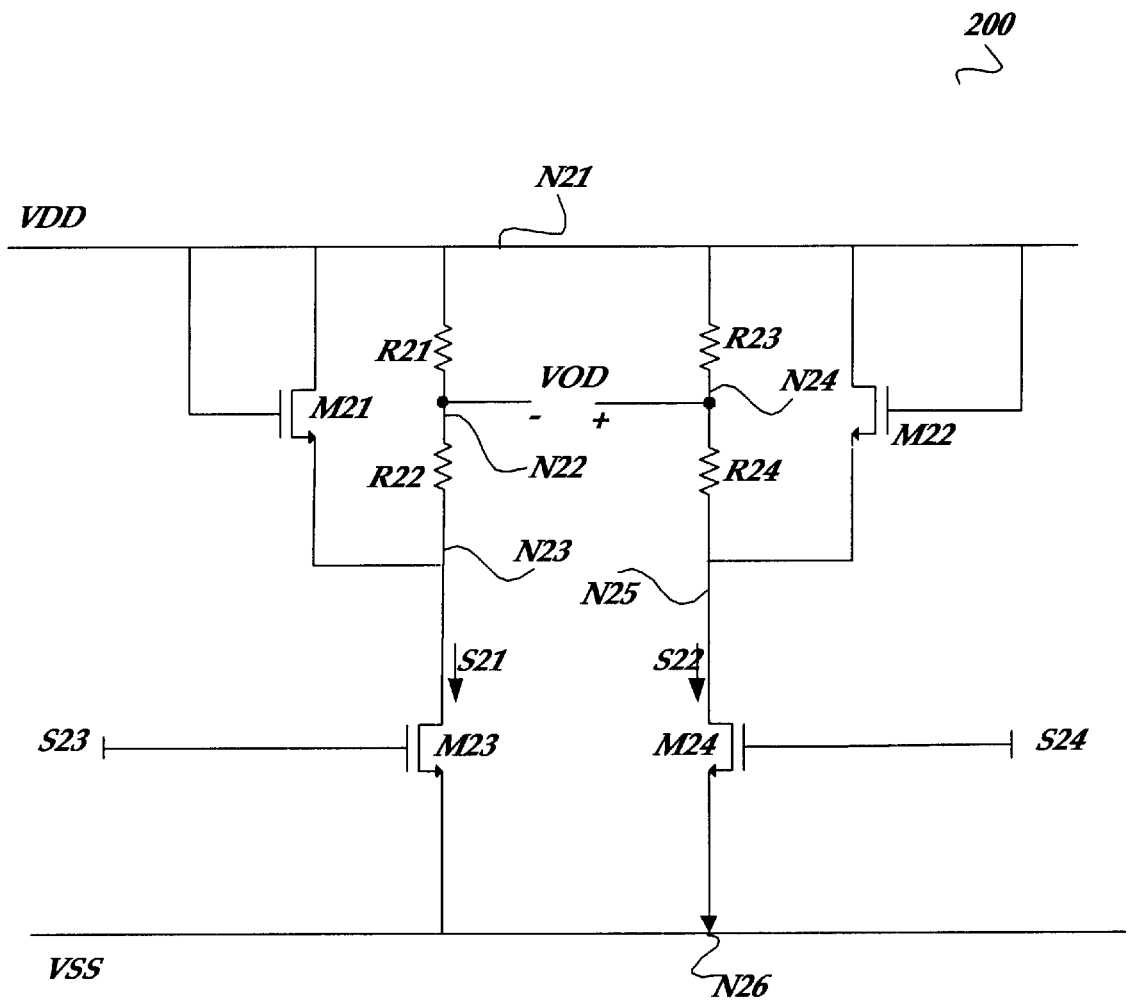
FIG. 2 shows a schematic diagram of a VOD restriction circuit for use with LVDS input buffers.

FIG. 2 is a schematic diagram of a voltage restriction circuit (VOD) for an LVDS driver, according to one embodiment of the invention. As shown in the figure, voltage restriction circuit 200 includes resistors R21, R22, R23, and R24 and transistors M21, M22, M23, and M24.

Resistor R21 is coupled between node N21 and node N22. Resistor R22 is coupled between node N22 and node N23. Resistor R23 is coupled between node N21 and node N24. Resistor R24 is coupled between node N24 and node N25. Transistor M21 has a drain coupled to node N21, a gate coupled to node N21, and a source coupled to node N23. Transistor M22 has a drain coupled to node N21, a gate coupled to node N21, and a source coupled to node N25. Transistor M23 has a drain coupled to node N23, a gate coupled to bias signal S23, and a source coupled to node N26. Transistor M24 has a drain coupled to node N25, a gate coupled to bias signal S24, and a source coupled to node N26. Node N21 is coupled to a voltage source (VDD). Node N26 is coupled to VSS.

Transistor M23 and transistor M24 are configured such that when M23 is fully on, M24 is fully off, and vice versa.

Differential output voltage VOD is the difference in voltage between node N22,and node N24. Differential output voltage VOD may be restricted by clamping the voltage across resistor R21 and resistor R23.

Transistors M21 and M22 are configured as diodes and act as clamps restricting VOD. Transistor M21 clamps the voltage across resistor R21. Transistor M22 clamps the voltage across resistor R23. Transistors M21 and M22 are both disabled ("off") when differential output voltage VOD remains below a predetermined threshold.

Transistor M21 acts as a pure diode when VOD reaches the $V_{TH}$ Of transistor M21. Therefore, transistor M21 is enabled when VOD− becomes less than the VOD+ by the predetermined threshold. Resistor circuit R22 creates a voltage offset between the drain and source of transistor M21. The enablement of transistor M21 prevents the differential output voltage (VOD) from exceeding the predetermined threshold. When transistor M21 is on an alternative path for the current is created, thereby restricting VOD by preventing the voltage drop across resistor R21 from increasing. The levels of signals S21 and S22 remain constant since the current is merely rerouted.

Similarly, transistor M22 is enabled when VOD+ becomes less than VOD− by the predetermined threshold. Resistor circuit R24 creates a voltage offset, between the drain and source of transistor M22. Transistor M22 acts as a pure diode when VOD reaches the $V_{TH}$ of transistor M22. The enablement of transistor M22 prevents the differential output voltage (VOD) from exceeding the predetermined threshold. When transistor M22 is on, an alternative path for the current is created, thereby restricting VOD by preventing the voltage drop across resistor R23 from increasing. The levels of signals S21 and S22 remain constant since the current is merely rerouted.

Resistors R22 and R24 create a sufficient voltage drop across transistors M21 and M22 to turn the transistors on. According to one embodiment of the invention, the value of resistors R22 and R24 is approximately 50 106 . The resistance of resistors R21 and R22 is chosen such that transistor M21 will turn on when VOD− is less than VOD+ by the predetermined threshold. According to one embodiment, the value of R21 is 200 106 . The resistance of resistors R23 and R24 is chosen such that transistor M22 will turn on when VOD+ is less than VOD− by the predetermined threshold. According to one embodiment, the value of R23 is 200 106 .

The resistance of resistor R21 is equal to the resistance of resistor R22. The resistance of R23 is equal to the resistance of R24. According to one embodiment of the invention, resistors R21, R22, R23, and R24 are $p^+$-poly resistors. $P^+$-poly resistors are chosen to reduce capacitance.

Although transistors M21 and M22 are used as the clamping circuits, transistors M21 and M22 may each be replaced by a diode. Transistors M21, M22, M23, and M24 may be n-channel or p-channel devices, NPN transistors, PNP transistors, Bipolar devices, MOS devices, GaAsFET devices, JFET devices, as well as one or more components that are arranged to provide the function of transistors M21, M22, M23, and M24 in the above described example. N-channel devices are used in one embodiment of the invention as they add less capacitance as compared to P-channel devices.

Figure 3:
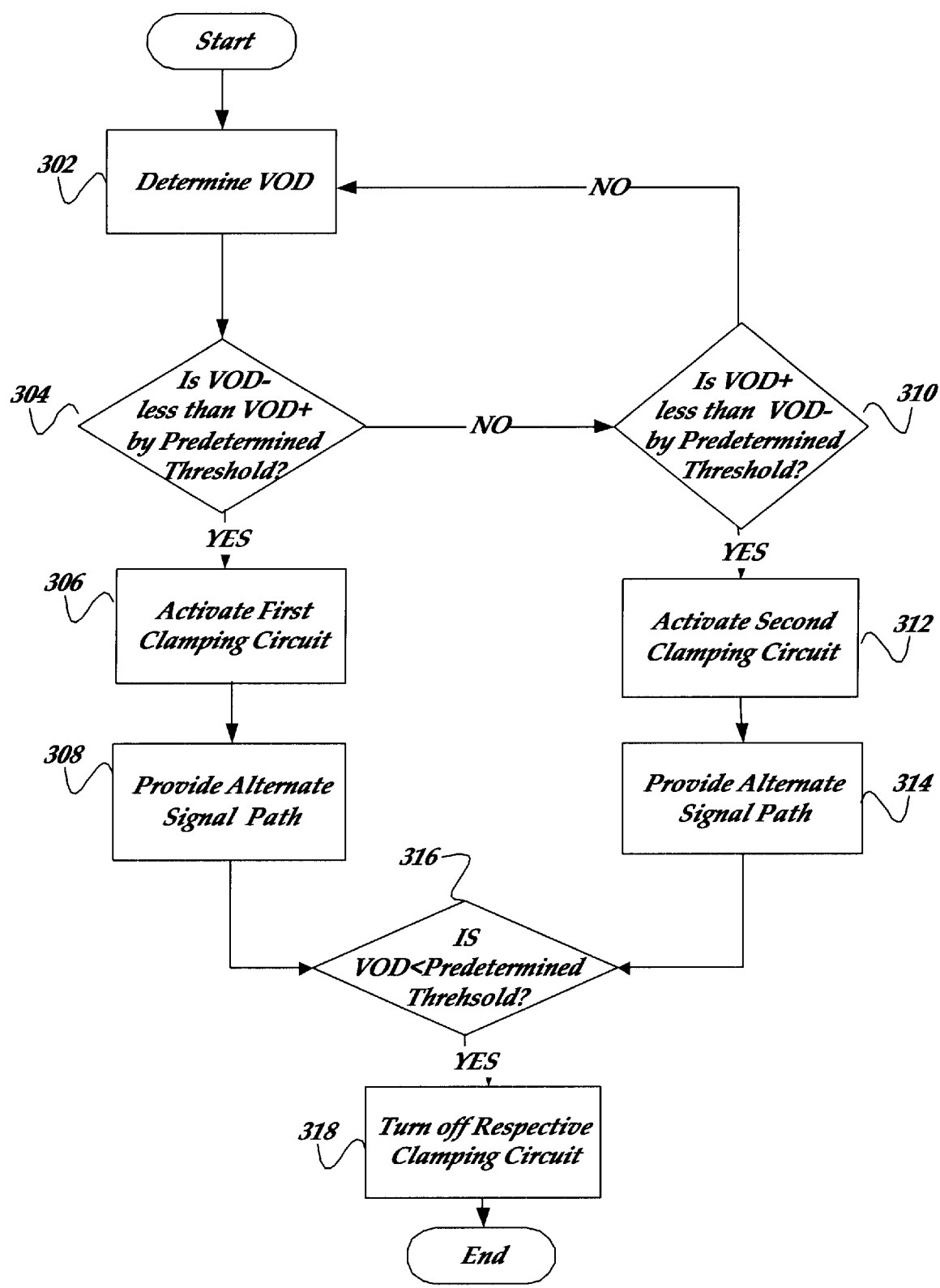
FIG. 3 illustrates a flow chart for a process for restricting the output differential voltage for use with LVDS input buffers, in accordance with aspects of the invention.

FIG. 3 shows a flow chart for restricting the differential output voltage (VOD) for LVDS input buffers, according to one embodiment of the present invention. After a start block, the logic moves to block 302 where the logic determines a differential output voltage (VOD) from VOD− and VOD+. Transitioning to decision block 304, the process determines if VOD− is less than VOD+ by a predetermined threshold. According to one embodiment of the invention, the predetermined threshold is 650 mV.

When VOD− is less than VOD+ by the predetermined threshold, the process moves to block 306 where a first clamping circuit is activated. The clamping circuit restricts VOD from exceeding the predetermined threshold. Transitioning to block 308, an alternate signal path is provided when the first clamping circuit is activated. The alternate signal path provides a path for the current to flow such that VOD is restricted.

When VOD− is not less than VOD+ the process flows to decision block 310 where the logic determines whether VOD+ is less than VOD− by the predetermined threshold. When VOD+ is not less than VOD− by the predetermined threshold, the logic returns to block 302. When VOD+ is less than VOD− by the predetermined threshold, the logic steps to block 312 where a second clamping circuit is activated. Transitioning to block 312, an alternate signal path is provided when the second clamping circuit is activated. The alternate signal path provides a path for the current to flow such that VOD is restricted. The process then moves to decision block 316 where the logic determines if VOD is less than the predetermined threshold. When VOD is less than the predetermined threshold, any clamping circuit activated is turned off. The logical flow then ends.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for restricting an output differential voltage (VOD) of an LVDS input buffer, comprising:
   a differential output voltage circuit configured to produce the output differential voltage (VOD), the differential output voltage circuit having an input coupled to an input signal, a first output coupled to a first output signal and a second output coupled to a second output signal;
   a first offset circuit configured to produce a first offset signal, the first offset circuit having an input coupled to the first output signal and an output coupled to the first offset signal;
   a second offset circuit configured to produce a second offset signal, the second offset circuit having an input coupled to the second output signal and an output coupled to the second offset signal;
   a first clamping circuit configured to restrict the VOD to be below a predetermined threshold, the first clamping circuit having an input coupled to the input signal, and an output coupled to the first offset signal; and
   a second clamping circuit configured to restrict the VOD to be below the predetermined threshold, the second clamping circuit having an input coupled to the input signal and an output coupled to the second offset signal.

2. The apparatus of claim 1, wherein the differential output voltage circuit, further comprises:
   a first resistor circuit arranged to produce a VOD−, the first resistor circuit coupled to the input signal; and
   a second resistor circuit arranged to produce a VOD+, the second resistor circuit coupled to the input signal.

3. The apparatus of claim 2, wherein the first clamping circuit and second clamping circuit, further comprises:
   a first diode circuit, the first diode circuit coupled between the input signal and the first offset signal; and
   a second diode circuit, the second diode circuit coupled between the input signal and the second offset signal.

4. The apparatus of claim 3, wherein the first diode circuit is a first transistor circuit, and wherein the second diode circuit is a second transistor circuit.

5. The apparatus of claim 4, wherein the differential output voltage circuit further comprises:
   a first current source coupled to the first output signal;
   a second current source coupled to the second output signal; and
   the first current source and the second current source configured such that when the first current source is fully on, the second current source is fully off, and when the second current source is fully on, the first current source is fully off.

6. The apparatus of claim 5, wherein the differential output voltage circuit, further comprises:
   a third resistor circuit coupled in series to the first resistor circuit and coupled to the first clamping circuit, wherein the third resistor circuit is configured to provide a voltage offset such that the first clamping circuit activates in response to the voltage offset; and
   a fourth resistor circuit coupled in series to the second resistor circuit and coupled to the second clamping circuit, wherein the fourth resistor is configured to provide a second voltage offset such that the second clamping circuit activates in response to the second voltage offset.

7. The apparatus of claim 6, wherein the predetermined threshold is 650 mV.

8. The apparatus in claim 6, wherein:
   the first transistor has a drain coupled to the first signal, a gate coupled to the first signal; and a source coupled to the first output signal; and
   the second transistor has a drain coupled to the first signal, a gate coupled to the first signal; and a source coupled to the second output signal.

9. The apparatus of claim 8, wherein the first resistor and second resistor are $p^+$-poly.

10. The apparatus of claim 9, wherein the first transistor and the second transistor are N-channel devices.

11. An apparatus for restricting an output differential voltage (VOD) of an LVDS input buffer, comprising:
    a first resistor coupled between a first node and a second node;
    a second resistor coupled between the first node and a third node;
    a third resistor coupled between the second node and a fourth node;
    a fourth resistor coupled between the third node and a fifth node;
    a first transistor circuit having a drain coupled to the first node, a gate coupled to the first node; and a source coupled to the fourth node; and
    a second transistor circuit having a drain coupled to the first node; a gate coupled to the first node; and a source coupled to fifth node, wherein the first transistor circuit and the second transistor circuit are configured to activate in response to an output differential voltage.

12. An apparatus for restricting an output differential voltage (VOD) of an LVDS input buffer, comprising:

a first resistor coupled between a first node and a second node;

a second resistor coupled between the first node and a third node;

a third resistor coupled between the second node and a fourth node;

a fourth resistor coupled between the third node and a fifth node;

a first transistor circuit having a drain coupled to the first node, a gate coupled to the first node; and a source coupled to the fourth node;

a second transistor circuit having a drain coupled to the first node; a gate coupled to the first node; and a source coupled to fifth node;

a third transistor having a drain coupled to the fourth node, a gate coupled to a first bias signal, and a source coupled to a sixth node; and a fourth transistor having a drain coupled to the fifth node, a gate coupled to a second bias signal, and a source coupled to the sixth node.

13. The apparatus of claim 12, wherein the first resistor, the second resistor, third resistor, and fourth resistor are $p^+$–poly.

14. The apparatus of claim 12, wherein the first transistor circuit and the second transistor circuit are configured to Activate in response to an output differential voltage.

15. A method for restricting a differential output voltage of an LVDS input buffer, comprising:

determining the differential output voltage, the differential output voltage including a VOD− and a VOD+;

producing an offset signal;

determining when the differential output voltage exceeds a predetermined threshold;

activating a clamping circuit in response to the offset signal to restrict the differential output voltage when the predetermined threshold has been exceeded by the differential output voltage; and providing an alternate signal path when the clamping circuit is activated.

16. The method of claim 15, wherein activating the clamping circuit further comprises:

activating a first clamping circuit when VOD− is less than VOD+ by the predetermined threshold; and activating a second clamping circuit when VOD+ is less than VOD− by the predetermined threshold.

17. The method of claim 16, wherein providing the alternate signal path, further comprises:

providing a first alternate current path when the first clamping circuit is activated; and providing a second alternate current path when the second clamping circuit is activated.

18. The method of claim 17, wherein the predetermined threshold is 650 mV.

19. An apparatus for restricting a differential output voltage of an LVDS input buffer, comprising:

a means for determining the differential output voltage; the differential output voltage including a VOD− and a VOD+;

a means for producing a first offset signal and a second offset signal;

a means for determining when the differential output voltage exceeds a predetermined threshold;

a means for activating a first clamping circuit in response to the first offset signal to restrict the differential output voltage when the predetermined threshold has been exceeded by the differential output voltage;

a means for activating a second clamping circuit in response to the second offset signal to restrict the differential output voltage when the predetermined threshold has been exceeded by the differential output voltage;

a means for providing a first alternate signal path when the first clamping circuit is active; and a means for providing a second alternate signal path when the second clamping circuit is active.

20. The apparatus of claim 19, wherein the predetermined threshold is 650 mV.

* * * * *